(12) United States Patent
Lee et al.

(10) Patent No.: US 10,451,245 B2
(45) Date of Patent: Oct. 22, 2019

(54) PHOSPHOR PLATE AND LIGHTING DEVICE INCLUDING THE SAME

(71) Applicant: LG INNOTEK CO., LTD., Seoul (KR)

(72) Inventors: In Jae Lee, Seoul (KR); Won Jin Kim, Seoul (KR); Jin Gyeong Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 325 days.

(21) Appl. No.: 15/502,388

(22) PCT Filed: Aug. 6, 2015

(86) PCT No.: PCT/KR2015/008266
§ 371 (c)(1),
(2) Date: Feb. 7, 2017

(87) PCT Pub. No.: WO2016/021971
PCT Pub. Date: Feb. 11, 2016

(65) Prior Publication Data
US 2017/0234506 A1    Aug. 17, 2017

(30) Foreign Application Priority Data

Aug. 7, 2014 (KR) .......................... 10-2014-0101674

(51) Int. Cl.
*F21V 3/08* (2018.01)
*F21V 3/04* (2018.01)
(Continued)

(52) U.S. Cl.
CPC .................. *F21V 3/08* (2018.02); *F21K 9/66* (2016.08); *F21V 3/049* (2013.01); *F21V 17/101* (2013.01);
(Continued)

(58) Field of Classification Search
None
See application file for complete search history.

(56) References Cited

U.S. PATENT DOCUMENTS

| 8,237,352 B2 * | 8/2012 | Sohn | B32B 27/08 |
| | | | 313/498 |
| 2009/0152582 A1 * | 6/2009 | Chang | H01L 33/507 |
| | | | 257/98 |

(Continued)

FOREIGN PATENT DOCUMENTS

| JP | 2004363342 A | 12/2004 |
| JP | 2005-268323 A | 9/2005 |

(Continued)

OTHER PUBLICATIONS

Supplementary European Search Report dated Feb. 14, 2018 in European Application No. 15829459.5.
(Continued)

*Primary Examiner* — Ashok Patel
(74) *Attorney, Agent, or Firm* — Saliwanchik, Lloyd & Eisenschenk (57) ABSTRACT

An embodiment of the present invention relates to a phosphor plate, which is a plate-shaped photo-conversion structure in which a phosphor is dispersed inside of a glass matrix, and has an uneven surface comprising at least one type of pattern, formed on at least one surface of the both surfaces of the plate, wherein the pattern occupies 70-95% of the area of the one surface.

16 Claims, 4 Drawing Sheets

(51) Int. Cl.
    *H01L 33/50*       (2010.01)
    *F21K 9/64*        (2016.01)
    *F21K 9/66*        (2016.01)
    *F21V 17/10*      (2006.01)

(52) U.S. Cl.
    CPC .............. *H01L 33/505* (2013.01); *F21K 9/64* (2016.08); *H01L 33/502* (2013.01); *H01L 33/504* (2013.01)

(56) References Cited

U.S. PATENT DOCUMENTS

| | | | | |
|---|---|---|---|---|
| 2010/0244067 | A1* | 9/2010 | Winkler | C04B 35/62813 |
| | | | | 257/98 |
| 2011/0090696 | A1* | 4/2011 | Nagai | H01L 33/505 |
| | | | | 362/293 |
| 2013/0161678 | A1* | 6/2013 | Sun | C09K 11/7734 |
| | | | | 257/98 |
| 2013/0258637 | A1* | 10/2013 | Wang | H01L 33/505 |
| | | | | 362/84 |
| 2014/0175377 | A1* | 6/2014 | D'Evelyn | H01L 33/44 |
| | | | | 257/13 |
| 2014/0300267 | A1* | 10/2014 | Oh | H01L 33/60 |
| | | | | 313/46 |
| 2015/0198303 | A1* | 7/2015 | Park | C09K 11/02 |
| | | | | 428/325 |

FOREIGN PATENT DOCUMENTS

| | | |
|---|---|---|
| JP | 2007-109946 A | 4/2007 |
| JP | 2007109946 A | 4/2007 |
| JP | 2007273989 A | 10/2007 |
| JP | 2014-082401 A | 5/2014 |
| KR | 1020120061517 A | 6/2012 |
| WO | WO 2009/119034 A1 | 10/2009 |
| WO | WO 2009/119034 A4 | 10/2009 |
| WO | WO 2013/069924 A1 | 5/2013 |

OTHER PUBLICATIONS

International Search Report in International Application No. PCT/KR2015/008266, filed Aug. 6, 2015.

\* cited by examiner

PHOSPHOR PLATE AND LIGHTING DEVICE INCLUDING THE SAME

CROSS-REFERENCE TO RELATED APPLICATION

This application is the U.S. national stage application of International Patent Application No. PCT/KR2015/008266, filed Aug. 6, 2015, which claims priority to Korean Application No. 10-2014-0101674, filed Aug. 7, 2014, the disclosures of each of which are incorporated herein by reference in their entirety.

TECHNICAL FIELD

An exemplary embodiment of the present invention relates to a lighting device and a phosphor plate constituting the same.

BACKGROUND ART

White light emitting diodes (LEDs) have attracted attention as highly efficient and highly reliable white lighting light sources, and thus some white LEDs are already provided for use as small micro-power light sources. There are various methods of realizing white LEDs. However, the most common and currently used method includes molding a blue LED element using a resin as a matrix together with a yellow phosphor. However, the resin may easily deteriorate since blue light has strong energy. Accordingly, since the resin is discolored when a white LED is used for a long time, a color tone of light emitted from the white LED having such a structure changes. Also, since heat is not easily dissipated from the element since the element is molded by the resin, the temperature may easily rise. The color of emitted light may shift toward yellow due to such an elevated temperature.

To solve these problems, phosphor plates in which a ceramic sintered body is used as a matrix material of a phosphor have been applied. However, when a ceramic sintered body is used, transmittance of the ceramic sintered body may be lowered by 30% to 40%, compared to conventional resin matrices. In this case, a large amount of light from a blue LED light source is not incident due to low transmittance of the ceramic sintered body, which makes it impossible to sufficiently excite the phosphor. Also, since the light from the blue light source is not sufficiently incident on the phosphor plate (i.e., an optical wavelength conversion portion), a decrease in light flux may be caused due to a decrease in concentration of the phosphor added to emit light with desired color coordinates.

Further, an integrally formed phosphor plate is subjected to surface polishing and processing in order to mount it on a light source element. In this case, light flux extraction may be degraded due to an increase in reflectance of light on a flat surface of the phosphor plate obtained through the surface polishing.

DISCLOSURE

Technical Problem

Therefore, embodiments of the present invention are designed to solve the problems of the prior art, and it is an object of the present invention to provide a phosphor plate with a plate-shaped photo-conversion structure in which a phosphor is dispersed inside a glass matrix. Here, an uneven surface having one or more patterns is formed on at least one of both surfaces of the phosphor plate, and the patterns occupy 70% to 95% of the area of the one surface.

Technical Solution

To solve the problems, according to one aspect of the present invention, there is provided a phosphor plate having a plate-shaped photo-conversion structure in which a phosphor is dispersed inside a glass matrix. Here, an uneven surface having one or more patterns is formed on at least one of both surfaces of the phosphor plate, and the patterns occupy 70% to 95% of the area of the one surface.

According to another aspect of the present invention, there is provided a lighting device including the phosphor plate and a light source element.

Advantageous Effects

According to exemplary embodiments of the present invention, a phosphor plate having a plate-shaped photo-conversion structure in which a phosphor is dispersed inside a glass matrix can be realized. Here, an uneven surface having one or more patterns is formed on at least one of both surfaces of the phosphor plate, and the patterns occupy 70% to 95% of the area of the one surface. Accordingly, the phosphor plate has an effect of improving light efficiency by minimizing a difference in refractive index through various patterns to improve brightness of light source elements and uniformity of light.

BEST MODE

Hereinafter, preferred embodiments of the present invention which can be easily practiced by those of ordinary skill in the art to which the present invention belongs will be described in detail with reference to the accompanying drawings.

Figure 1:
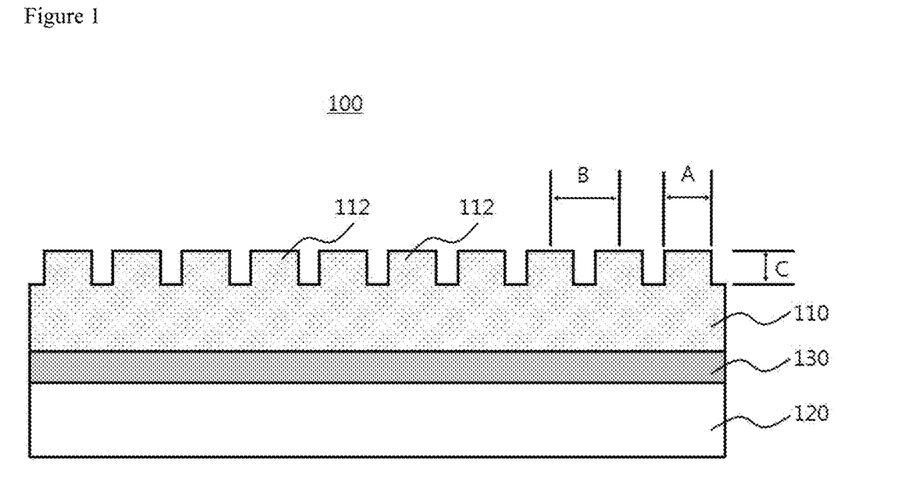
FIG. 1 is a cross-sectional view of a light diffusion unit included in a lighting device according to this exemplary embodiment.
Figure 2:
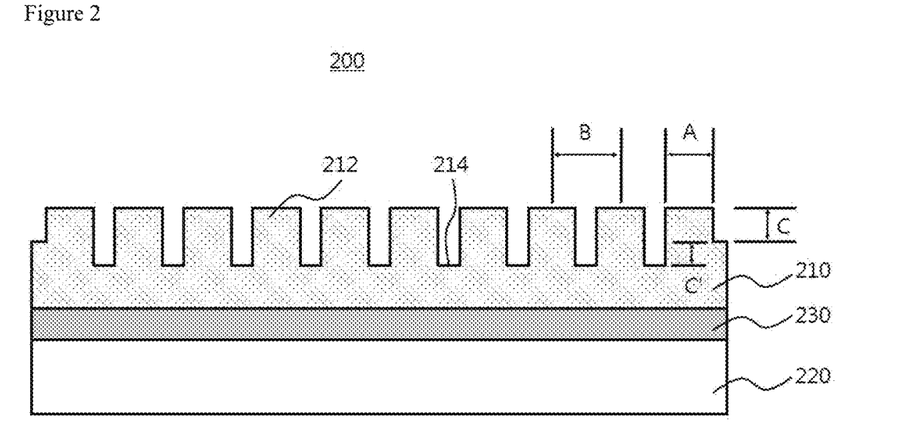
FIG. 2 is a cross-sectional view of a light diffusion unit included in a lighting device according to this exemplary embodiment.
Figure 3:
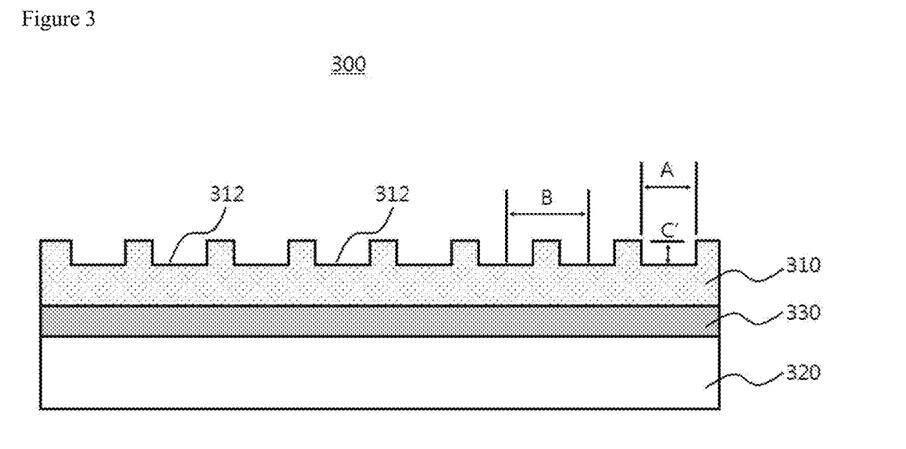
FIG. 3 is a cross-sectional view of a light diffusion unit included in a lighting device according to this exemplary embodiment.

Phosphor plates 110, 210 and 310 according to this exemplary embodiment have an uneven surface formed on at least one surface thereof. Here, the uneven surface has one or more patterns 112, 212 and 312, and the patterns 112, 212 and 312 occupy 70% to 95% of the area of the one surface.

FIGS. 1 to 3 are cross-sectional views of light diffusion units 100, 200 and 300 included in a lighting device according to this exemplary embodiment. First, the phosphor plates 110, 210 and 310 in the light diffusion units 100, 200 and 300 will be described, and the other parts 120, 130, 220, 230, 320 and 330 will be described later.

Referring to FIGS. 1 to 3, the phosphor plates 110, 210 and 310 according to this exemplary embodiment have a plate-shaped photo-conversion structure in which a phosphor is dispersed inside a matrix. The matrix of the phosphor plates 110, 210 and 310 may be formed of a glass material. In general, a phosphor in the form of particles may be mixed with a glass frit, and the resulting mixture may be sintered to obtain a phosphor plate. A material having a transmittance of 70% to 80% and a refractive index of 1.5 to 1.7 with respect to glass having a thickness of 190 µm after sintering may be used as the glass material. When the phosphor is mixed with a glass frit and the mixture is sintered, the transmittance and refractive index of the glass material may be lowered. Thus, glass materials having a proper transmittance and refractive index may be selected and used, depending on the types of phosphors. Different compositions of the glass material may be used in consideration of the desired optical characteristics and heat processing characteristics of a phosphor plate and the types of phosphors to be mixed.

A mixture including two or more phosphors selected from the group consisting of yttrium-aluminum-garnet (YAG)-based, lutetium-aluminum-garnet (LuAG)-based, nitride-based, sulfide-based, and silicate-based phosphors may be used as the phosphor. A phosphor having a wavelength range of 530 nm to 600 nm (green to yellow) may be selected as the phosphor.

A phosphor in the form of particles or powder may be used as the phosphor. In this case, a phosphor having a particle diameter of 10 µm to 20 µm may be used. In the phosphors, a phosphor having a refractive index of 1.5 to 2.5 is preferably used. The phosphor is mixed at a content of 10% by weight to 20% by weight with respect to the glass frit. In this case, an amount of the mixed phosphor may vary depending on the transmissivity and color difference after sintering. Also, the content of the phosphor may vary depending on a change in thickness. In this case, a smaller amount of the phosphor may be added when the thickness is increased.

The phosphor plates 110, 120 and 130 may be manufactured using the following method. A mixture of the glass frit and the phosphor is put into a stainless use steel (SUS) mold, and uniaxially compressed to have a plate or disc shape. The size of the mold may vary depending on the use of the phosphor plate. For example, a disc-shaped mold may be used for a down-light product for a lighting so that the product has a diameter of 50 to 100 mm and a thickness of 200 µm to 600 µm. Also, in the case of an outdoor lighting, a hexahedral mold may be used so that the phosphor plate after sintering has a size of 1×1×0.16 to 1×1×0.2 mm (W×D×H) for a product for an automotive headlamp having a size of 15×60×0.5 mm (W×D×H).

In this case, the compression is performed at a load of 5 tons to 8 tons for 5 to 10 minutes. The compressed phosphor/glass frit mixture is put into a sintering furnace to perform a sintering process. In this case, a temperature and time required to perform a sintering process may be adjusted depending on the glass transition temperatures ($T_g$) of the phosphor and the glass frit.

The thickness of the completely sintered phosphor plates 110, 210 and 310 may be adjusted to satisfy desired characteristics in this exemplary embodiment. Surface polishing may be further performed to adjust surface roughness. In this case, the ceramic photo-conversion member is polished to have a thickness of 200 µm to 1,000 µm a surface roughness of 0.1 µm to 0.3 µm.

The phosphor plates 110, 210 and 310 thus obtained may be subjected to a conventional patterning process to form patterns 112, 212 and 312, respectively. In this exemplary embodiment, a patterned sapphire substrate (PSS) process is used during an LED process to form the patterns 112, 212 and 312.

A photoresist (PR) is applied onto surfaces of the phosphor plates 110, 210 and 310 whose surfaces are finely processed, or a dry film resist (DFR) is attached to the surfaces of the phosphor plates 110, 210 and 310. The phosphor plates 110, 210 and 310 are exposed through a patterned mask, developed, and then subjected to wet or dry etching, depending on the desired characteristics. In this case, the patterns 112, 212 and 312 of the phosphor plates 110, 210 and 310 are indicated by rectangular patterns, as shown in FIGS. 1 to 3, but the present invention is not limited thereto. For example, the patterns 112, 212 and 312 may be formed as patterns having other shapes such as dome (hemispherical), conical, pyramidal, cylindrical, and hexagonal prism shapes. Also, the patterns 112, 212 and 312 may be formed as convex or concave patterns or mixed concave/convex patterns. FIG. 1 shows a convex pattern, FIG. 2 shows a mixed concave/convex pattern, and FIG. 3 shows a concave pattern. The mixed concave/convex pattern has a structure in which a concave pattern 214 is further formed within the convex pattern 212.

The size A of the patterns 112, 212 and 312 represents a size of the underside of a pattern, that is, a size of one side when the underside is in a square shape, or a diameter when the underside is in a circular shape. The size A of the patterns 112, 212 and 312 may be in a range of 5.0 µm to 8.0 µm, and the distance B of the patterns 112, 212 and 312 may be in a range of 7.0 µm to 10 µm, based on a central point of the pattern. The size A and distance B of the patterns may be adjusted to adjust the area occupancy to within a range of 70% to 95%. When the occupancy is less than 70%, it is impossible to obtain a sufficient diffuse reflection effect due to the low occupancy of the pattern shape, resulting in poorly increased light flux when compared to conventional patterns. On the other hand, when the occupancy is greater than 95%, blue light emitted from the light source element may not easily penetrate the phosphor plate, resulting in shifted color coordinates.

The height C or depth C' of the patterns 112, 212 and 312 may be in a range of 0.3 µm to 1.5 µm. When the patterns are mixed concave/convex patterns 212 and 214 (see FIG. 2), the sum of the height C and the depth C' should not be greater than 2 µm. In this exemplary embodiment, a reason for forming the patterns 112, 212 and 312 on the phosphor plate 110, 210 and 310 is to prevent light radiated from light source elements 120, 220 and 320 from being back-scattered on the phosphor plate. As a result, a difference in refractive index may be minimized through various patterns. Light extraction should be performed as much as possible through diffuse reflection of light. Here, when the height C or depth C' of the patterns 112, 212 and 312 is less than 0.3 µm, it is impossible to improve light efficiency due to low diffuse reflection, and light efficiency may be rather degraded.

The lighting device according to another aspect of this exemplary embodiment includes light diffusion units 100, 200 and 300 composed of the above-described phosphor plates 110, 210 and 310 and the light source elements 120, 220 and 320, respectively. Referring to FIGS. 1 to 3, the patterned phosphor plates 110, 210 and 310 may be stacked on the light source elements 120, 220 and 320 via adhesive layers 130, 230 and 330 including at least one adhesive, respectively.

The light source elements 120, 220 and 320 are elements that emit light. By way of one example, a solid light-emitting element may be applied. A light emitting diode (LED), an organic light emitting diode (OLED), a laser diode (LD), a laser, or a vertical-cavity surface-emitting laser (VCSEL) may be used as the solid light-emitting element. Types of elements used in the art may be used as the light source elements 120, 220 and 320. In particular, in this exemplary embodiment, elements emitting bluish light may be used.

The light source elements 120, 220 and 320 are coated with the adhesive layers 130, 230 and 330 to be attached to the phosphor plates 110, 210 and 310. The adhesive layers 130, 230 and 330 may be formed by coating with at least one adhesive. After curing, the adhesive layers 130, 230 and 330 may have a thickness of 2 μm to 5 μm. When the thickness is less than 2 μm, the light source elements 120, 220 and 320 may be peeled off due to insufficient adhesive strength, and may be deformed due to heat generated from the light source elements 120, 220 320. On the other hand, when the thickness is greater than 5 μm, the refractive indices and transmittances of the light diffusion units 100, 200 and 300 may be severely degraded, resulting in declined light efficiency. Types of adhesives may be used without particular limitation as long as they are not deformed after curing due to heat generated from the light source elements 120, 220 and 320.

Also, although not shown in FIGS. 1 to 3, the peripheries of the light source elements 120, 220 and 320 may be coated and molded with a white molding material (i.e., paint) to prevent light leakage of the light source elements 120, 220 and 320. The white molding material is preferably a perfectly reflecting material having a reflectance of 99.8% or more. As necessary, a mixture of the white molding material and spherical particles having high reflectance may be used for coating.

Hereinafter, the present invention will be described in further detail with reference to exemplary embodiments thereof. However, it should be understood that the following exemplary embodiments are provided merely to aid in understanding the present invention, and not intended to limit the scope of the present invention.

[Pattern Simulations]

The patterns were simulated for pattern shape, position, convex/concave shape, arrangement, and the like under the conditions listed in the following Table 1 to determine light efficiency characteristics.

(Color coordinates and luminous intensity distributions were not considered)

Figure 4:
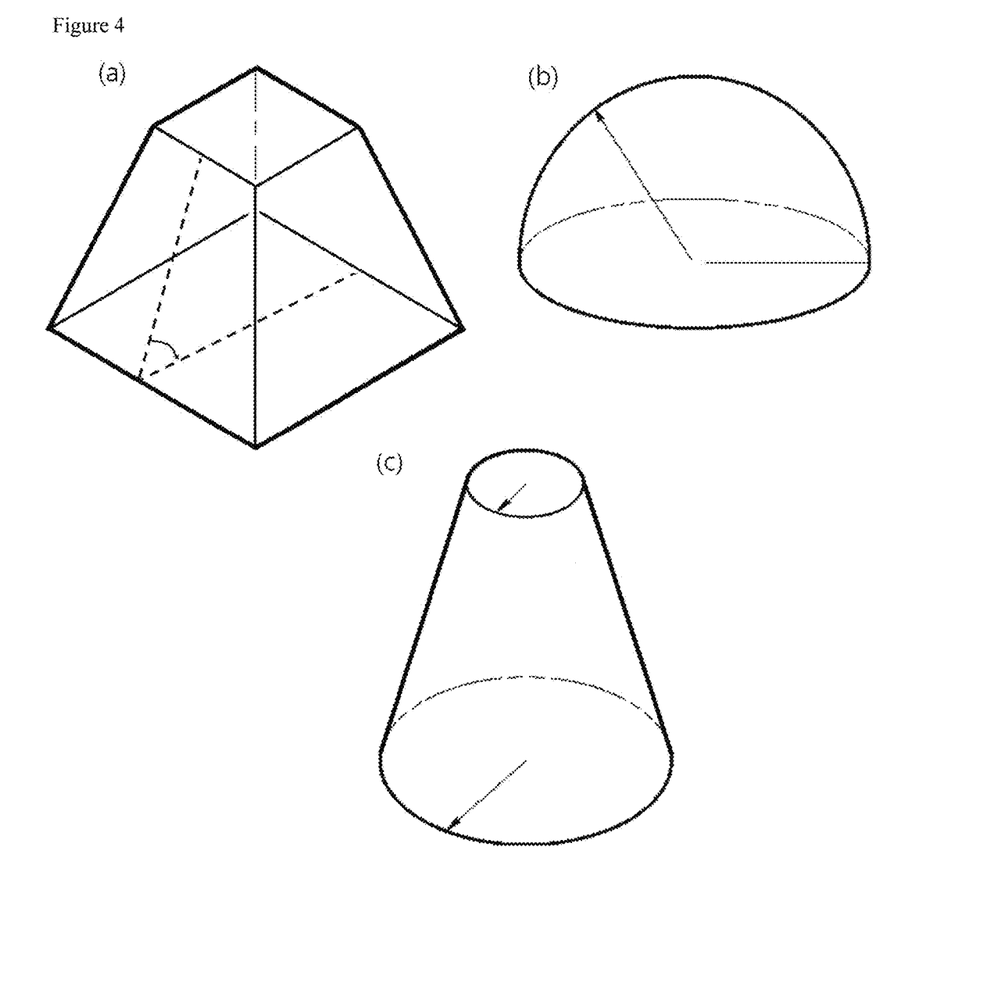
FIG. 4 is a perspective view of patterns applied to simulations according to this exemplary embodiment.

The shapes of the patterns are shown in FIG. 4.

TABLE 1

| Items | Pattern | Convex/concave | Top/bottom | Efficiency | Efficiency ratio |
|---|---|---|---|---|---|
| Comparative Example | — | — | — | 65.32 | 1 |
| Pattern 1 | Pyramid | Convex | Top | 72.56 | 1.1108 |
| Pattern 2 | (4 × 4 × 2) | | Bottom | 64.42 | 0.9862 |
| Pattern 3 | | Concave | Top | 73.11 | 1.1193 |
| Pattern 4 | | | Bottom | 65.8 | 1.0073 |
| Pattern 5 | Hemisphere | Convex | Top | 74.77 | 1.1447 |
| Pattern 6 | (Φ4 × 2) | | Bottom | 61.64 | 0.9437 |
| Pattern 7 | | Concave | Top | 71.9 | 1.1007 |
| Pattern 8 | | | Bottom | 66.15 | 1.0127 |
| Pattern 9 | Cone 1 | Convex | Top | 73.01 | 1.1177 |
| Pattern 10 | (Φ4 × 2) | | Bottom | 65.44 | 1.0018 |
| Pattern 11 | | Concave | Top | 72.18 | 1.1050 |
| Pattern 12 | | | Bottom | 64.57 | 0.9885 |
| Pattern 13 | Cone 2 | Convex | Top | 73.94 | 1.1320 |
| Pattern 14 | (Φ4 × 4) | Concave | Top | 73.57 | 1.1263 |
| Pattern 15 | Sphere_Hexa | Convex | Top | 75.58 | 1.1571 |
| Pattern 16 | (Φ4 × 2) | Concave | Top | 72.39 | 1.1082 |
| Pattern 17 | Cone_Hexa | Convex | Top | 73.16 | 1.1200 |
| Pattern 18 | (Φ4 × 2) | Concave | Top | 72.16 | 1.1047 |

(In Table 1, "Hexa" represents a structure in which one unit of the pattern is adjacent to six other units of the pattern, that is, a honeycomb structure)

From the simulation results, it was revealed that the efficiency was improved by approximately 110% or more when pyramid-shaped, spherical and conical convex/concave patterns were applied to the top surface of the phosphor plate, compared to when there were no patterns. However, it was revealed that the efficiency was slightly improved or degraded when the patterns were applied to the bottom surface of the phosphor plate.

In the case of the certain shapes, that is, conical and pyramid shapes of the patterns in which the light efficiency is maximized, it is possible to optimize an angle of an incline plane, etc. From the simulation results, it was also revealed that the denser the distance between the patterns was, the more advantageous it was to improving the light efficiency.

EXAMPLES

Preparation of Phosphor Plate

Glass and a phosphor having the following characteristics were mixed to prepare a phosphor plate having a thickness of 160 μm.

1) Glass material

Transmittance: 75% (transmittance of glass only based on thickness of 190 μm)

Refractive index: 1.613

2) Phosphor

LuAG phosphor having a wavelength of 550 nm, a particle diameter of 15 μm, a content of 15% by weight, and a refractive index of 1.8

Nitride phosphor having a wavelength of 595 nm, a particle diameter of 15 μm, a content of 2% by weight, and a refractive index of 2.0

Examples 1 and 2: Patterning of Phosphor Plates

One surface of the phosphor plate thus prepared was subjected to surface polishing to make the surface flat. Thereafter, the surface of the phosphor plate was coated with a photoresist according to a patterned sapphire substrate (PSS) process, exposed to light according to a pattern, and then etched to form patterns on the surface of the phosphor plate (Table 2).

TABLE 2

| Items | Patterning conditions | |
|---|---|---|
| | Pattern | Pattern height |
| Example 1 | PSS pattern | 0.4 μm |
| Example 2 | PSS pattern | 1.0 μm |

Comparative Example

Comparative Example

The phosphor plate thus prepared was subjected to surface polishing without performing a patterning process.

[Evaluation]

1. Evaluation of Optical Characteristics of Integrated Types

Each of the light source elements satisfying the requirements listed in the following Table 3 was coated with a silicon adhesive resin (Dow KER-2300 having a refractive index of 1.42) to a thickness of 3 μm. Thereafter, each of the patterned phosphor plates of Examples 1 and 2 and the non-patterned phosphor plate of Comparative Example was attached to the light source element, and optical characteristics were measured. The results are listed in the following Table 4.

TABLE 3

| p-GaN | GaN |
|---|---|
| | [Mg] 5.0E18, 2000A |
| MQW | In0.14Ga.0xN 4 pairs |
| | 25A (InGaN)/80A (GaN) |
| n-GaN | GaN (4.5 μm) |
| | [Si] 1.0E19 |
| Size | 0.98 × 0.98, 2 Wires |
| White molding material | WR-3001 Reflectance: 99.8% |

Peak at 442 nm, FWHM 21 nm

TABLE 4

| Items | Cx | Cy | lm | Relative comparison |
|---|---|---|---|---|
| Example 1 | 0.3247 | 0.3273 | 1905.0 | 94% |
| Example 2 | 0.3299 | 0.3434 | 2092.4 | 103% |
| Comparative Example | 0.325 | 0.3358 | 2027.0 | 100% |

2. Evaluation of Optical Characteristics of Remote Types

Each of the light source elements satisfying the requirements listed in Table 1 was mounted on an integrating sphere to determine optical characteristics. Thereafter, each of the patterned phosphor plate of Example 1 and the non-patterned phosphor plate of Comparative Example was mounted on an integrating sphere to measure color coordinates (CIE), light flux, light efficiency, and surface roughness. The results are listed in the following Table 5 and shown in FIG. 5.

TABLE 5

| | Light flux (Lumen) | CIE | | Light efficiency (Lm/Wrad) | Note |
|---|---|---|---|---|---|
| | | Cx | Cy | | |
| Example 1 (top view) | 638.9 | 0.4425 | 0.5042 | 251.2 | 101.5% |
| Example 1 (bottom view) | 638.2 | 0.4426 | 0.5039 | 251.0 | 101.4% |
| Comparative Example | 641.4 | 0.4412 | 0.5040 | 247.5 | 100% |

Referring to Table 5, it can be seen that there was a change between the light flux before patterning and the light flux after patterning. Also, it was revealed that there was no difference in light flux either when a portion of the light source element in contact with the light source element was patterned or vice versa.

Figure 5:
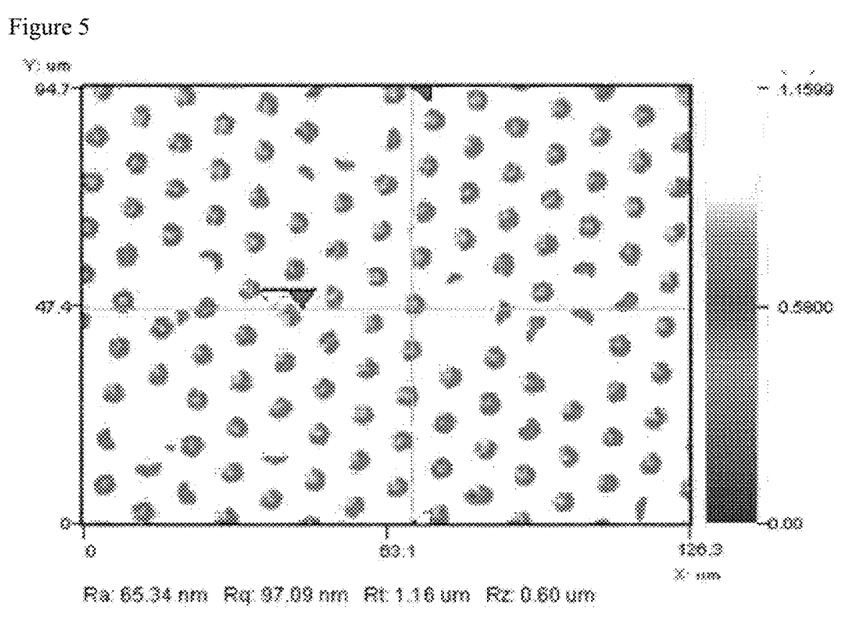
FIG. 5 is a chart showing results of measuring surface roughness of a phosphor plate according to this exemplary embodiment.

(In FIG. 5, Ra represents an average value for the whole section, Rq represents an RMS value of Ra (average value), Rt represents a value obtained by adding the upper and lower maximum values, based on a central line of the whole measurement section, Rz (DIN) represents a value obtained by dividing the whole measurement section into five subsections, determining the maximum values for the respective subsections, and dividing the sum of the maximum values by 5, and a color bar on the right of the drawing represents a depth of a pattern)

The description set forth herein has been merely exemplary and illustrative of exemplary embodiments for the purpose of describing the scope of the present invention, and it will be apparent to those skilled in the art to which the present invention belongs that various modifications and changes can be made without departing from the scope of the present invention. Thus, it should be understood that the exemplary embodiments set forth herein are merely exemplary embodiments for the purpose of illustration only, and not intended to limit the scope of the invention. Accordingly, it should be understood that the scope of the present invention is defined by the appended claims, and that the scope of the present invention defined by the appended claims and their equivalents is intended to cover the scope of the present invention.

The invention claimed is:

1. A phosphor plate comprising:
   a matrix having one surface and an other surface opposite the one surface;
   a phosphor dispersed inside the matrix; and
   an uneven surface disposed on at least one of the one surface and the other surface and having one or more patterns,
   wherein the patterns occupy 70% to 95% of a whole surface area of either the one surface or the other surface, and
   wherein each unit of the patterns has a width (A) in a range of 5.0 μm and 8.0 μm and a height (C) or a depth (C') in range of 0.3 μm to 1.5 μm.

2. The phosphor plate of claim 1, wherein the patterns have a distance (B) of 7.0 μm to 10 μm, based on a central point of one unit of the patterns.

3. The phosphor plate of claim 2, wherein the matrix has a plate-shaped structure comprising a glass material.

4. The phosphor plate of claim 2, wherein the phosphor has a refractive index of 1.5 to 2.5.

5. The phosphor plate of claim 2, wherein the phosphor comprises two or more phosphors selected from the group consisting of yttrium-aluminum-garnet (YAG)-based, lutetium-aluminum-garnet (LuAG)-based, nitride-based, sulfide-based, and silicate-based phosphors.

6. The phosphor plate of claim 5, wherein the phosphor has a wavelength range of 530 nm to 600 nm.

7. The phosphor plate of claim 1, wherein the uneven surface has a single layout structure including a concave pattern or a convex pattern formed on a surface of the matrix, or a mixed pattern structure in which the concave pattern and the convex pattern are mixed.

8. The phosphor plate of claim 7, wherein a sum of the height (C) and the depth (C') of each unit of the patterns is less than or equal to 2 μm when the pattern formed on the uneven surface is a mixed pattern of concave shapes and convex shapes.

9. A lighting device comprising:
a light source element; and
a phosphor plate disposed below the light source element, wherein the phosphor plate comprises a matrix having one surface and an other surface opposite the one surface, a phosphor dispersed inside the matrix, and an uneven surface disposed on either the one surface or the other surface and having one or more patterns,
wherein the patterns occupy 70% to 95% of a whole surface area of the one surface or the other surface, and
wherein each unit of the patterns has a width (A) in a range of 5.0 μm and 8.0 μm and a height (C) or a depth (C') in range of 0.3 μm to 1.5 μm.

10. The lighting device of claim 9, wherein a light exit surface of the light source element and the surface opposite the surface on which the uneven surface is formed are disposed in the phosphor plate to be adjacent to each other.

11. The lighting device of claim 9, wherein the lighting device comprises an adhesive layer disposed between the light source element and the phosphor plate.

12. The lighting device of claim 11, wherein the adhesive layer has a thickness of 2 μm to 5 μm.

13. The lighting device of claim 9, wherein the light source element is at least one element selected from the group consisting of a light emitting diode (LED), an organic light emitting diode (OLED), a laser diode (LD), a laser, and a vertical-cavity surface-emitting laser (VCSEL).

14. The lighting device of claim 13, wherein the light source element is a blue light source element.

15. The lighting device of claim 9, wherein at least one surface of the light source element is coated with a molding material.

16. The lighting device of claim 15, wherein the molding material has a reflectance of 99.8% or more.

* * * * *